United States Patent
Emmi et al.

(10) Patent No.: US 6,268,621 B1
(45) Date of Patent: Jul. 31, 2001

(54) VERTICAL CHANNEL FIELD EFFECT TRANSISTOR

(75) Inventors: Peter A. Emmi, Hyde Park; Byeongju Park, Wappingers Falls, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/366,147

(22) Filed: Aug. 3, 1999

(51) Int. Cl.[7] .................. H01L 27/108; H01L 29/76; H01L 29/94
(52) U.S. Cl. .................. 257/302; 257/321; 438/192
(58) Field of Search .................. 257/302, 321, 257/329, 303; 438/192, 206, 209, 212

(56) References Cited

U.S. PATENT DOCUMENTS

| | | |
|---|---|---|
| 4,466,175 | 8/1984 | Coe . |
| 4,654,295 | 3/1987 | Yang et al. . |
| 5,034,785 * | 7/1991 | Blanchard .................. 357/23.4 |
| 5,072,276 * | 12/1991 | Malhi et al. .................. 357/42 |
| 5,312,782 | 5/1994 | Miyazawa . |
| 5,340,759 | 8/1994 | Hsieh et al. . |
| 5,349,228 | 9/1994 | Leudeck et al. . |
| 5,552,620 | 9/1996 | Lu et al. . |
| 5,627,393 * | 5/1997 | Hsu .................. 257/331 |
| 5,641,694 | 6/1997 | Kenney . |
| 5,672,889 * | 9/1997 | Brown .................. 257/77 |
| 5,817,562 | 10/1998 | Chang et al. . |

OTHER PUBLICATIONS

S. Campbell, *The Science and Engineering of Microelectronic Fabrication*, pp. 84–85 Oxford University Press (1996).
C. Y. Chang and S. M. Sze, *USLI Technology*, pp. 131–134 The McGraw–Hill Companies, Inc. (1996).

* cited by examiner

*Primary Examiner*—David Nelms
*Assistant Examiner*—Dung Ans Le
(74) *Attorney, Agent, or Firm*—Ratner & Prestia; Tiffany L. Townsend, Esq.

(57) ABSTRACT

A vertical channel field effect transistor and a process of manufacturing the same. The vertical channel field effect transistor is disposed on a surface of a substrate and comprises an epitaxial silicon stack having a bottom terminal comprising heavily doped silicon, a channel comprising lightly doped silicon of opposite doping type from the bottom terminal, and a top terminal comprising heavily doped silicon of the same doping type as the bottom terminal. The vertical channel field effect transistor also comprises a gate dielectric layer covering at least a portion of the bottom terminal, the channel, and the top terminal, and a gate in contact with the gate dielectric layer. The gate is positioned adjacent the channel and adjacent at least a portion of the bottom terminal and top terminal. The channel has a thickness between the bottom terminal and the top terminal from about 50 angstroms to about 800 angstroms.

7 Claims, 5 Drawing Sheets

VERTICAL CHANNEL FIELD EFFECT TRANSISTOR

TECHNICAL FIELD

The present invention generally relates to a vertical channel field effect transistor and to a process for manufacturing the transistor. More particularly, the present invention relates to a vertical channel field effect transistor having a short channel length and to a process of manufacturing such a structure.

BACKGROUND OF THE INVENTION

The integrated circuit industry continues to explore techniques to pack more circuits onto a given semiconductor substrate. Accordingly, more and more thought is being devoted to orienting the various devices in planar fashion along the surface of the substrate. Thought is also being devoted to orienting the devices vertically either by building devices "up" from the substrate surface or by burying devices in trenches formed within the face of the semiconductor body.

Currently, a majority of circuits and memory chips are fabricated using metal-oxide semiconductor field effect transistor (MOSFET) technology. This technology places conventional horizontal MOSFET circuits having a source and drain at the same level on the substrate. With appropriate voltage adjustments, the circuits can be reduced in area simply by scaling to smaller dimensions. Specifically, all dimensions of the various process masks can be uniformly reduced so that the resulting circuitry is fabricated in a smaller area on the semiconductor wafer. Unfortunately, the process of scaling down a MOSFET circuit presents certain difficulties.

Reduction of the channel length has been the single biggest variable in reducing the dimensions of field effect transistors. Conventional horizontal field effect transistors rely on the capability of photolithographic tools to define the channel length. Therefore, the performance of conventional field effect transistors is limited by the capability of the available photolithographic tools. As of 1999, the photolithographic limit on the channel length is about 0.15 microns (1,500 angstroms).

In addition to reducing the field effect transistor dimensions, reduction of the channel length offers performance advantage. In thin film field effect transistors, the device output currents and high speed are dependent on the length of the semiconductor conduction channel formed between the source electrode and the drain electrode under the influence of the gate electrode. The source-to-drain output current is inversely proportional to the channel length, while the operating frequency is inversely proportional to the square of the channel length. Thus, when the channel length of the device is reduced by an order of magnitude, for example from 2 to 0.2 microns, the output current should increase 10 fold and the operating speed or frequency increases approximately 100 fold.

The operating speed also depends on the interelectrode capacitance of the device; a large capacitance causes slower operation. The extension of the gate electrode over the source and drain electrodes is a common source of interelectrode capacitance, and is referred to as "overlap" parasitic capacitance. The overlap is a result of limited photolithographic resolution.

Large area arrays of multiple thin film field effect transistors may be prepared by standard 0.2 micron photolithography. When so prepared, the minimum channel length that can be achieved in planar thin film transistor arrays is limited by photolithographic feature and is typically on the order of 0.2 microns as of 1999. One way to overcome the limitations inherent in large area photolithographic resolution is to use a vertical structure in which channel length is determined by vertical separation of the source and drain electrodes.

There remains a need for a field effect transistor design capable of achieving short channel length and faster operation that is not constrained by photolithographic limits. Therefore, an object of the present invention is to provide a vertical channel FET having reduced dimensions as compared to conventional field effect transistors, particularly a reduced channel length between the source and drain. A related object is to provide a vertical channel FET that is not constrained by photolithographic limits. Another object is to provide a vertical channel FET having relatively fast operation. Still another object of the present invention is to overcome the shortcomings of conventional field effect transistors. Other objects and advantages will become apparent from the following detailed description.

SUMMARY OF THE INVENTION

To achieve this and other objects, and in view of its purposes, the present invention provides a vertical channel field effect transistor disposed on a surface of a substrate. The vertical channel field effect transistor comprises an epitaxial silicon stack having a bottom terminal comprising heavily doped silicon, a channel comprising lightly doped silicon of opposite doping type from the bottom terminal, and a top terminal comprising heavily doped silicon of the same doping type as the bottom terminal. The bottom terminal and top terminal are wired such that one is the source and the other is the drain of the field effect transistor, depending on the particular use of the field effect transistor. The vertical channel field effect transistor also comprises a gate dielectric layer covering at least a portion of the top terminal, the channel, and the bottom terminal, and a gate in contact with the gate dielectric layer. The gate is positioned adjacent the channel and adjacent at least a portion of the bottom terminal and top terminal. The channel has a thickness between the bottom terminal and the top terminal from about 50 angstroms to about 800 angstroms. Preferably, the thickness of the channel is from about 100 angstroms to about 500 angstroms.

According to a further aspect of the present invention, there is provided a process of manufacturing a vertical channel field effect transistor. The process comprises forming a mask on a substrate surface, the mask having an epitaxial silicon stack trench extending to the substrate surface. Next, an epitaxial silicon stack is formed on the substrate surface, the epitaxial silicon stack having a bottom terminal comprising heavily doped silicon, a channel comprising lightly doped silicon of opposite doping type from the bottom terminal, and a top terminal comprising heavily doped silicon of the same doping type as the bottom terminal. Following formation of the epitaxial silicon stack, at least a portion of the mask is removed to expose portions of the top terminal, channel, and bottom terminal. Next, a gate dielectric layer is formed on the exposed portions of the top terminal, channel, and bottom terminal. A gate is then formed in contact with the gate dielectric layer such that the gate is positioned adjacent the channel and adjacent at least a portion of the bottom terminal and the top terminal.

Preferably, formation of the epitaxial silicon stack comprises the following steps. First, a bottom silicon layer is grown on the substrate surface and is simultaneously doped to form the bottom terminal. Next, a channel silicon layer is grown on the bottom terminal and is simultaneously doped to form the channel. Following formation of the channel, a top silicon layer is grown on the channel and is simultaneously doped to form the top terminal.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The invention will next be illustrated with reference to the figures in which the same numbers indicate the same elements in all figures. Such figures are intended to be illustrative, rather than limiting, and are included to facilitate the explanation of the process of the present invention.

Figure 1:
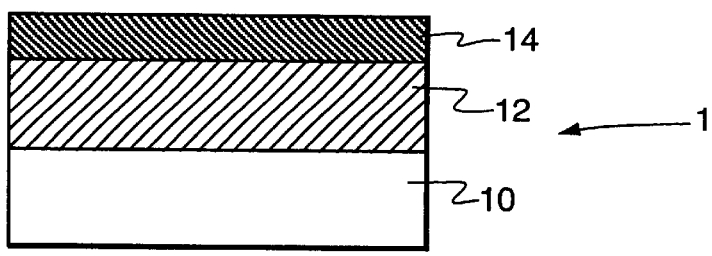
FIG. 1 shows a silicon wafer having an insulator layer and a silicon layer disposed on the silicon wafer.

The process of the invention begins by forming a substrate 1, such as a silicon wafer. In a preferred embodiment, the substrate 1 is a silicon-on-insulator (SOI) substrate, such as that illustrated in FIG. 1, comprising a silicon wafer 10, an insulator layer 12, and a silicon layer 14. The silicon-on-insulator substrate can be formed using conventional techniques.

Preferably, silicon layer 14 is heavily doped, such as by ion implantation, with a dopant of the same conductivity type as that which will be used to dope the bottom terminal (described below). By doping the silicon layer 14, the resistivity between the silicon layer 14 and the bottom terminal can be reduced. The substrate 1 and, more specifically, the silicon layer 14 has a surface 18.

Figure 2:
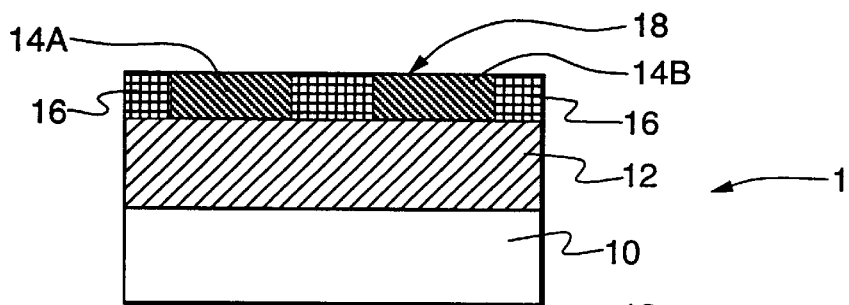
FIG. 2 shows the structure of FIG. 1 having shallow trench isolation (STI) islands formed in the silicon layer, thereby forming multiple silicon islands.

Following formation of the substrate 1, a shallow trench isolation (STI) island 16 is formed in the silicon layer 14 such that the silicon layer 14 has at least one silicon island (illustrated in FIG. 2 as silicon islands 14A and 14B) surrounded by the STI islands 16. The STI islands 16 can be formed using conventional techniques which are well known in the art.

Figure 3:
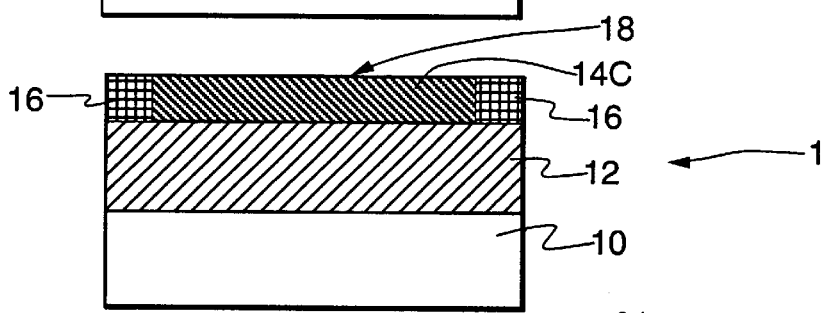
FIG. 3 shows the structure of FIG. 1 having STI islands formed in the silicon layer, thereby forming a single silicon island.

As described below, a single vertical channel field effect transistor of the present invention is formed on a silicon island. In another embodiment of the substrate 1 of the present invention, illustrated in FIG. 3, a silicon island 14C is formed such that at least two vertical channel field effect transistors can be formed on the silicon island 14C. Although described and illustrated below with reference to a single vertical channel field effect transistor being formed on a silicon island, it should be appreciated that two or more vertical channel field effect transistors can be formed on a single silicon island. When two or more transistors share the same silicon island, the bottom terminals of these transistors can be wired below the field effect transistor device top surface, which is well below the conventional first level connection. This configuration offers a further advantage over conventional field effect transistor designs by reducing the density of required wiring connections above the transistor. In addition, although the present invention is described and illustrated as forming a vertical channel effect transistor on each silicon island, it should be appreciated that all of the silicon islands do not necessarily have a vertical channel field effect transistor disposed on them.

Figure 4:
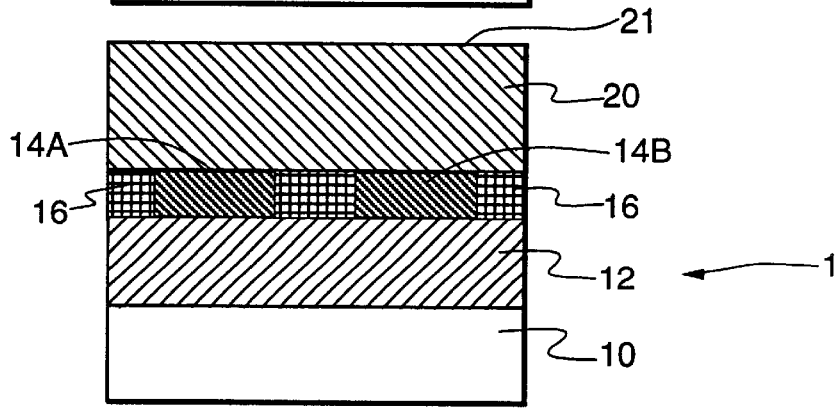
FIG. 4 shows the structure of FIG. 2 further having a mask formed on the silicon islands and STI islands.

In the next step of the process of the present invention, a mask 20 is formed on the surface 18 of the substrate 1. The mask 20 has a surface 21. The resulting structure is illustrated in FIG. 4. The mask 20 is selected from those masks conventionally used. Preferably, the mask 20 consists of an oxide layer deposited by low pressure chemical vapor deposition (LPCVD) with tetraethosiloxane (TEOS). Alternatively, the mask 20 can consist of an oxide layer formed by other deposition techniques, such as plasma enhanced chemical vapor deposition (PECVD), or the mask can consist of a nitride provided the selective epitaxial growth process (described below) does not deposit a material on the mask 20.

Figure 5:
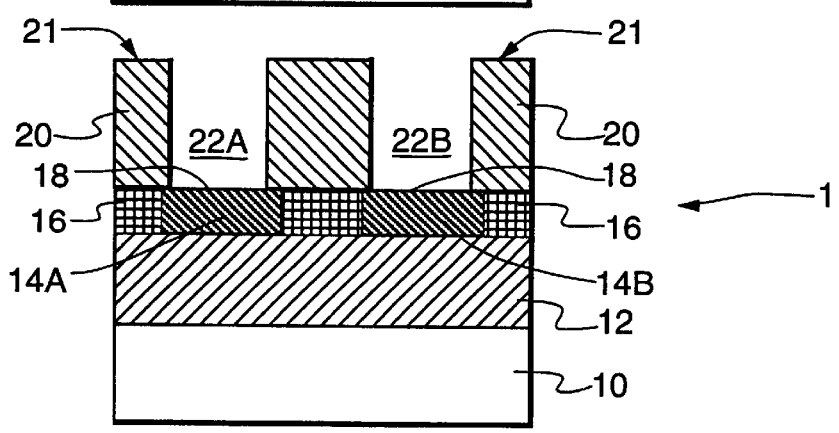
FIG. 5 shows the structure of FIG. 4 after the mask has been partially removed to form epitaxial silicon stack trenches, each trench extending to a silicon island.

Following formation of the mask 20, a portion of the mask 20 is removed such that at last one epitaxial silicon stack trench is formed, shown in FIG. 5 as epitaxial silicon stack trenches 22A and 22B. As illustrated in FIG. 5, the epitaxial silicon stack trenches 22A and 22B are formed such that they extend from the surface 21 of the mask 20 to the surface 18 of the silicon islands (shown in FIG. 5 as silicon islands 14A and 14B). The epitaxial silicon stack trenches 22A and 22B can be formed using conventional techniques. Preferably, the epitaxial silicon stack trenches 22A and 22B are formed by reactive ion etching (RIE) the mask 20.

Figure 6:
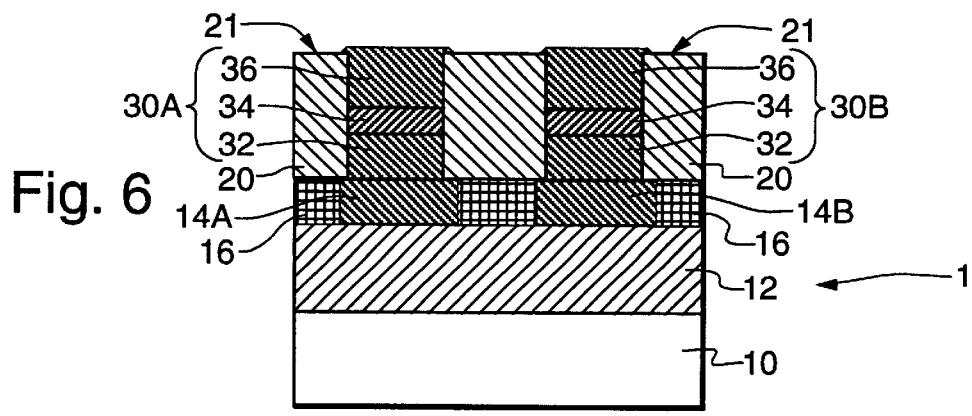
FIG. 6 shows the structure of FIG. 5 after an epitaxial silicon stack comprising a bottom terminal, a channel, and a top terminal has been formed in the epitaxial silicon stack trenches.

In the next step of the process of the present invention, epitaxial silicon stacks are formed in the epitaxial silicon stack trenches 22A and 22B. FIG. 6 illustrates two epitaxial silicon stacks 30A and 30B formed in the epitaxial silicon stack trenches 22A and 22B, respectively. As illustrated in FIG. 6, each epitaxial silicon stack 30A, 30B has a bottom terminal 32, a channel 34, and a top terminal 36. In the present invention, the length of channel 34 is controlled by the dopant diffusion profile control, i.e., by formation of an abrupt transition in the dopant level achieved upon replacing conventional lithography-based channel length control with selective epitaxial growth deposition techniques.

In contrast to conventional field effect transistors, the present invention is not limited by the capability of photolithographic tools to define the channel length. Rather, the diffusion of dopants during the deposition process and the subsequent thermal cycling define the dopant diffusion profile and, thus, the length of channel 34.

Although previous processes used selective epitaxy to achieve device isolation or epitaxial lateral overgrowth, the present invention uses selective epitaxy to grow a channel within a predefined trench in a mask. Device isolation is achieved by the use of a silicon-on-insulator (SOI) layer below each device and shallow trench isolation (STI) which isolates each device. The combination of this isolation scheme and the use of selective epitaxy within a predefined trench in a mask allows the manufacture of a vertical channel field effect transistor capable of achieving enormous switching speed due to the vertically tailored short channel.

In a first embodiment, the epitaxial silicon stack 30A, 30B is formed by the following steps. First, the bottom terminal 32 is formed by growing a bottom silicon layer on the substrate surface 18 using the selective epitaxial growth process. The selective epitaxial growth process is described by C. Chang and S. Sze, *ULSI Technology*, pages 131–34 (1996). Before the selective epitaxial silicon deposition process, it is likely that the silicon surface will first require cleaning (ex-situ, in-situ, or both) to remove contaminants. The bottom silicon layer is then heavily doped by ion implantation to form the bottom terminal 32.

The thickness of the bottom terminal 32 is from about 50 angstroms to about 3,000 angstroms. Preferably, the thickness of the bottom terminal 32 is from about 200 angstroms to about 800 angstroms. The thickness of the bottom terminal 32 is primarily determined by considering the bulk resistivity of the bottom terminal 32 and the overlap parasitic capacitance between the gate and the bottom terminal 32. In general, a reduction in the thickness of the bottom terminal 32 lowers the bulk resistivity of the bottom terminal 32 and increases the overlap parasitic capacitance. Conversely, an increase in the thickness of the bottom terminal 32 raises the bulk resistivity of the bottom terminal 32 and reduces the overlap parasitic capacitance.

Following formation of the bottom terminal 32, the channel 34 and top terminal 36 are then formed. First, a channel-top silicon layer is formed on the bottom terminal 32 using the selective epitaxial growth process. This channel-top silicon layer is then doped using ion implantation to form the channel 34 and top terminal 36. Specifically, the ion implantation used to form the channel 34 consists of a low-dose, high-energy, deep implant. The ion implantation used to form the top terminal 36 consists of a low-energy, shallow implant of a heavy dopant. The dopant used to form the channel 34 is of opposite conductivity type from that used to form the bottom terminal 32 and the top terminal 36. The resulting structure is illustrated in FIG. 6. The low-energy, shallow implant and high-energy, deep implant can be accomplished using techniques conventionally known in the art.

The thickness of the channel 34 is from about 50 angstroms to about 800 angstroms. Preferably, the thickness of the channel 34 is from about 100 angstroms to about 500 angstroms. The thickness of the top terminal 36 is from about 50 angstroms to about 3,000 angstroms. Preferably, the thickness of the top terminal 36 is from about 500 to 1,500 angstroms. More preferably, the thickness of the top terminal 36 is from about 200 angstroms to about 800 angstroms such that a sharp top terminal-to-channel junction is formed. Although the dopant profile between the bottom terminal 32 and the channel 34 depends on purely thermal diffusion of dopant, the dopant profile between the top terminal 36 and the channel 34 depends on both abruptness of the initial implant dopant profile as well as on later thermal diffusion of dopants.

In a second preferred embodiment, the epitaxial silicon stack 30A, 30B is formed by the following steps. First, a cluster tool is provided. The cluster tool contains a transfer chamber having an inert ambient. The cluster tool also has at least one epitaxial growth process chamber directly connected to the transfer chamber, preferably two epitaxial growth process chambers, and more preferably three epitaxial growth process chambers.

Next, the bottom terminal 32, channel 34, and top terminal 36 of the epitaxial silicon stack 30A, 30B are formed in the cluster tool in a step-wise fashion. The bottom terminal 32 is formed using the selective epitaxial growth process to grow a bottom silicon layer on the substrate surface 18 and simultaneously heavily doping this bottom silicon layer (i.e., in situ doping) in a first epitaxial growth process chamber. The bottom terminal 32 is formed such that it has a thickness from about 50 angstroms to about 3,000 angstroms. Preferably, the thickness of the bottom terminal 32 is from about 200 angstroms to about 800 angstroms.

Following formation of the bottom terminal 32, the wafer is then transferred from the epitaxial growth process chamber and through the transfer chamber to a second epitaxial growth process chamber for formation of the channel 34. The channel 34 is formed by using the selective epitaxial growth process to grow a channel silicon layer on the bottom terminal 32 and simultaneously lightly doping this layer (i.e., in situ doping) with a dopant of opposite conductivity type from that used to dope the bottom terminal 32. The channel 34 is formed such that it has a thickness from about 50 angstroms to about 800 angstroms. Preferably, the channel 34 has a thickness from about 100 angstroms to about 500 angstroms.

Although, in principle, all of the doped selective epitaxial processes can be performed in one chamber to form the bottom terminal 32, channel 34, and top terminal 36, the suppression of undesired dopant incorporation, commonly called autodoping, is best achieved by using separate chambers for different dopant types. By keeping different dopant types in different process chambers, the process can be tightly controlled. The inert ambient of the transfer chamber protects against the formation of native oxide during transfer of the wafer between processing chambers.

Following formation of the channel 34, the wafer is transferred from the second epitaxial growth process chamber and through the transfer chamber to the first epitaxial growth process chamber for formation of the top terminal 36. Preferably, the wafer is transferred to a third epitaxial growth process chamber rather than the first epitaxial growth process chamber to form the top terminal 36. The top terminal 36 is formed by selectively growing a top silicon layer on the channel 34 and simultaneously heavily doping this layer (i.e., in situ doping) with a dopant of the same conductivity type as that used to dope the bottom terminal 32. The top terminal 36 is formed such that it has a thickness from about 50 angstroms to about 3,000 angstroms. Preferably, the thickness of the top terminal 36 is from about 500 angstroms to about 1,500 angstroms. More preferably, the thickness of the top terminal 36 is from about 200 angstroms to about 800 angstroms such that a sharp top terminal-to-channel junction is formed.

The bottom terminal 32 and top terminal 36 can be doped with an $n^+$ dopant and the channel 34 can be doped with a $p^-$ dopant. Alternatively, the bottom terminal 32 and top terminal 36 are doped with a $p^+$ dopant and the channel 34 is doped with an $n^-$ dopant.

Often, both n-channel and p-channel type field effect transistors are desired in a chip, such as in a complementary metal-oxide-semiconductor (CMOS) circuit. In accordance with the present invention, both n-channel and p-channel type field effect transistors can be formed on a single substrate. In a first embodiment, either an n-channel or a p-channel type field effect transistor is first formed using the process of the invention. Next, this field effect transistor is masked and a second silicon island is exposed. The other field effect transistor type is then formed using the process of the invention. Techniques for masking a field effect transistor and exposing a silicon island are well known in the art. The sequential growth of two types of field effect transistors can be achieved using both embodiments, described above, for the formation of an individual field effect transistor. Preferably, the process of forming field effect transistors of opposite type is achieved using in-situ doping during the selective epitaxial deposition step.

In a second embodiment, both n-channel and p-channel type field effect transistors can be manufactured in parallel. By manufacturing n-channel and p-channel field effect transistors in parallel, thermal cycling of the first-formed field effect transistor is avoided during the formation of the second field effect transistor.

The process of forming n-channel and p-channel field effect transistors in parallel consists of the following steps. First, at least two bottom silicon layers are grown by selective epitaxial growth in differing epitaxial silicon stack trenches, such as epitaxial silicon stack trenches 22A, 22B illustrated in FIG. 5. Next, one of the bottom silicon layers is masked and the other bottom silicon layer is ion implanted to form a heavily doped bottom terminal. Next, this bottom terminal is masked and the remaining bottom silicon layer is unmasked such that the bottom silicon layer is exposed. This bottom silicon layer is than heavily doped with a dopant of opposite conductivity type from that of the first bottom terminal to form a second bottom terminal. The wafer is then cleaned to substantially remove native oxide, if any, that has formed on the exposed silicon. The thickness of the bottom terminal 32 is from about 50 angstroms to about 3,000 angstroms. Preferably the thickness of the bottom terminal 32 is from about 200 angstroms to about 800 angstroms.

Following formation of the bottom terminal 32, the channel 34 and top terminal 36 are then formed. First, a channel-top silicon layer is formed, without doping, on the bottom terminal 32 by selective epitaxial growth. This channel-top silicon layer is then doped using ion implantation to form the channel 34 and the top terminal 36. Specifically, the ion implantation used to form the channel 34 consists of a low-dose, high-energy implant. The ion implantation used to form the top terminal 36 consists of a low-energy, heavy-dose, shallow ion implant. The dopant used to form the channel 34 is of opposite conductivity type from that used to form the bottom terminal 32 and the top terminal 36. FIG. 6 illustrates the resulting structure. The low-energy, shallow implant and high-energy, deep implant can be accomplished using techniques conventionally known in the art.

The thickness of the channel 34 is from about 50 angstroms to about 800 angstroms. Preferably, the thickness of the channel 34 is from about 100 angstroms to about 500 angstroms. The thickness of the top terminal 36 is from about 50 angstroms to about 3,000 angstroms. Preferably, the thickness of the top terminal 36 is from about 500 to 1,500 angstroms. More preferably, the thickness of the top terminal 36 is from about 200 angstroms to about 800 angstroms such that a sharp top terminal-to-channel junction is formed.

Following formation of the epitaxial silicon stack 30A, 30B, the remaining steps of the process of the present invention can be separated into the manufacture of a single gate or a dual gate vertical channel field effect transistor.

SINGLE GATE

One embodiment of the present invention includes a vertical channel field effect transistor having a single gate. The process of forming a single gate vertical channel field effect transistor of the present invention is described next.

Figure 7:
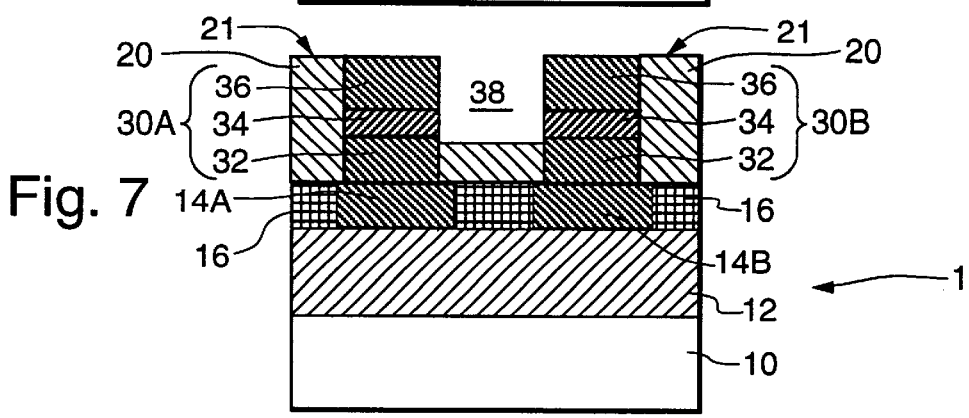
FIG. 7 shows the structure of FIG. 6 after the mask has been removed between the epitaxial silicon stacks adjacent the top terminal, channel, and a portion of the bottom terminal to form a gate trench.

Following formation of the epitaxial silicon stack 30A, 30B, illustrated in FIG. 6, the next step is the formation of a gate trench 38. The gate trench 38 is formed by the removal of the mask 20 between the epitaxial silicon stack 30A, 30B adjacent the top terminal 36, channel 34, and at least a portion of the bottom terminal 32. The portion of the bottom terminal 32 to be removed corresponds to the overlap of the gate with the bottom terminal 32 in a field effect transistor. The resulting structure is illustrated in FIG. 7.

The gate trench 38 can be formed using conventional techniques. Preferably, the mask 20 is removed to form the gate trench 38 by patterning the mask 20 using photolithography and reactive ion etching (RIE) the mask 20.

Figure 8:
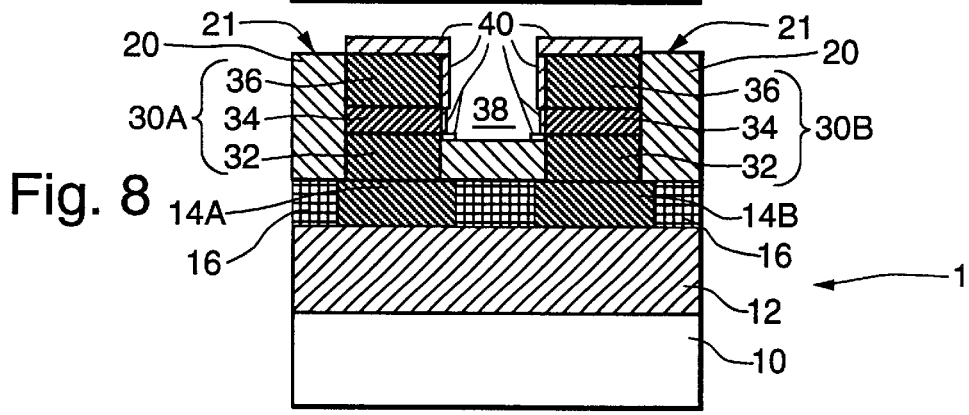
FIG. 8 shows the structure of FIG. 7 in which a gate dielectric layer covers the exposed portions of the top terminal, channel, and bottom terminal.

In the next step of the process of the present invention, a gate dielectric layer 40 is formed on the exposed portions of the top terminal 36, the channel 34, and the bottom terminal 32. The resulting structure is illustrated in FIG. 8.

The gate dielectric layer 40 is composed of a dielectric material and can be formed using conventional techniques. The gate dielectric layer 40 reduces the source/drain-to-gate leakage. In a preferred embodiment, the gate dielectric layer 40 comprises an oxide, such as silicon oxide, formed by thermal oxidation. As shown in FIG. 8, when forming the gate dielectric layer 40 by thermal oxidation, the thickness of the gate dielectric layer 40 adjacent the bottom terminal 32 and top terminal 36 is greater than the thickness of the gate dielectric layer 40 adjacent the channel 34. This is a result of the differing doping characteristics of the bottom terminal 32, channel 34, and top terminal 36 and is described by S. Campbell, *The Science and Engineering of Microelectronic Fabrication*, pages 84–85 (1996). Having a thicker oxide over the top terminal 36 and bottom terminal 32 reduces the overlap parasitic capacitance between the gate and the top or bottom terminals and also decreases the chance of gate dielectric breakdown.

Following formation of the gate dielectric layer 40, a gate is formed in the gate trench 38. The gate is formed such that it contacts the gate dielectric layer 40 and is positioned adjacent the channel 34 and at least a portion of the bottom terminal 32 and the top terminal 36.

Figure 9:
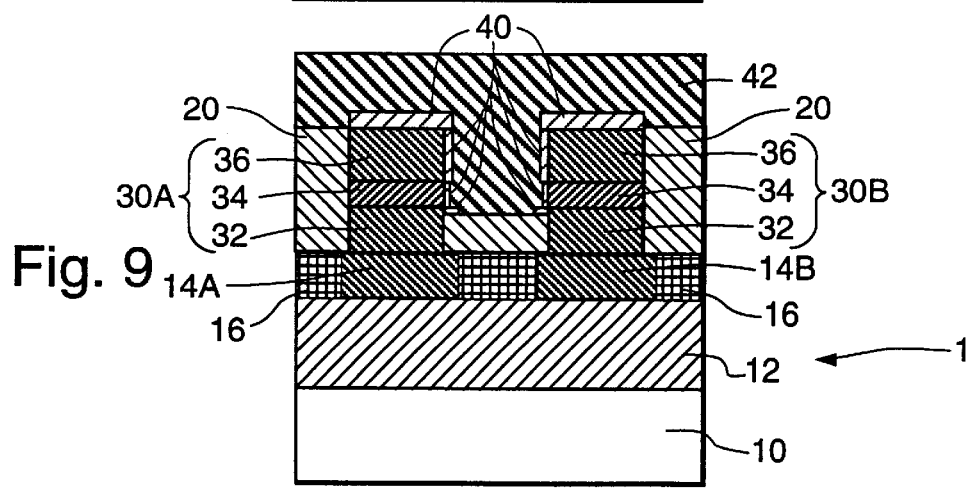
FIG. 9 shows the structure of FIG. 8 having a gate layer formed.
Figure 10:
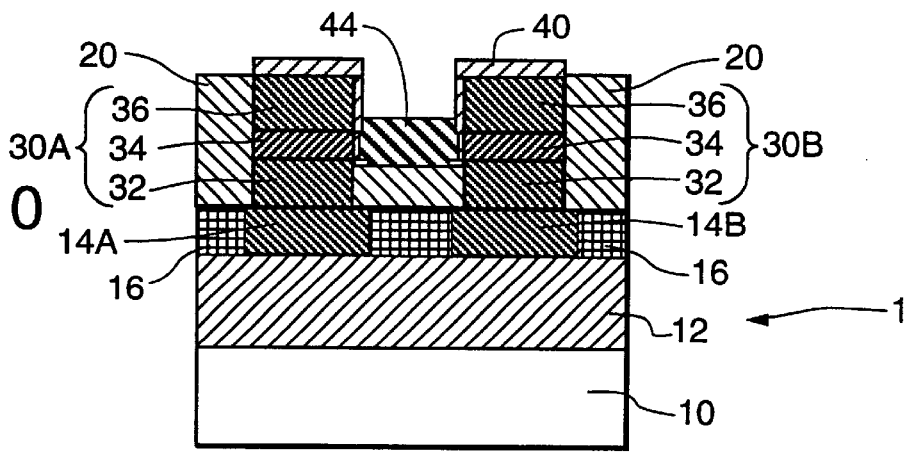
FIG. 10 shows the structure of FIG. 9 after the gate layer has been partially removed to form a gate.

The gate can be formed by first forming a gate layer 42 in the gate trench 38 and extending out of the gate trench 38 onto the gate dielectric layer 40 and mask 20. The resulting structure is illustrated in FIG. 9. Next, the gate layer 42 is selectively removed such that a gate 44 is formed contacting the gate dielectric layer 40 and positioned adjacent the channel 34 and at least a portion of the bottom terminal 32 and top terminal 36. The resulting structure is illustrated in FIG. 10. The gate layer 42 can be removed using conventional techniques. Preferably, the gate layer 42 is removed to form the gate 44 by reactive ion etching (RIE) the gate layer 42.

The gate 44 is composed of a conductive material. Preferably, the gate 44 consists of heavily doped polysilicon of the same doping type as the bottom terminal 32 and top terminal 36.

Figure 11:
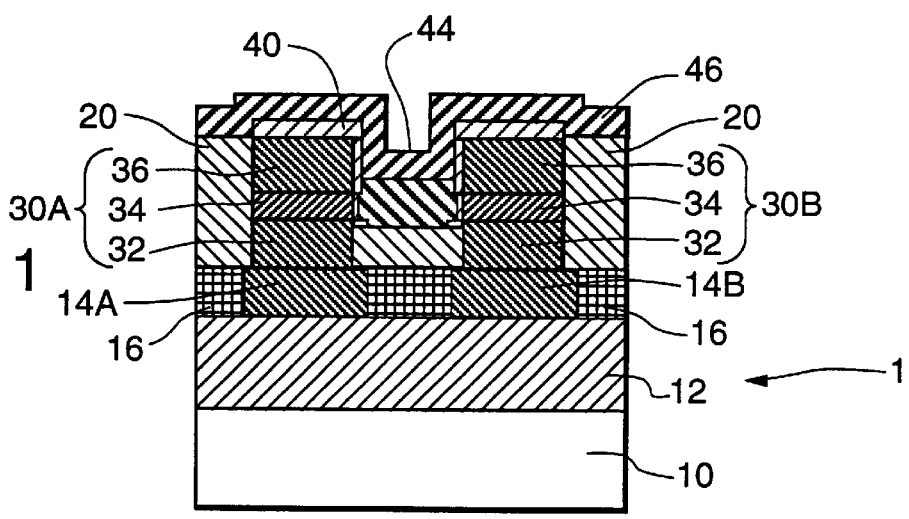
FIG. 11 shows the structure of FIG. 10 having a barrier layer formed.

Following formation of the gate 44, a barrier layer 46 can optionally be formed to cover the gate 44 if desired. The resulting structure is illustrated in FIG. 11. The barrier layer 46 is composed of a dielectric material, such as an oxide or a nitride. The barrier layer 46 reduces electrical coupling between the top terminal 36 and the gate contact. In addition, if the barrier layer 46 is composed of a material different from that of the gate dielectric layer 40, the reactive ion etching (RIE) process used to form the gate contact can be self-aligning to the gate 44, thereby avoiding shorts with the top terminal 36. Preferably, the barrier layer 46 is a low-temperature nitride, such as a nitride deposited by plasma enhanced chemical vapor deposition (PECVD).

Figure 12:
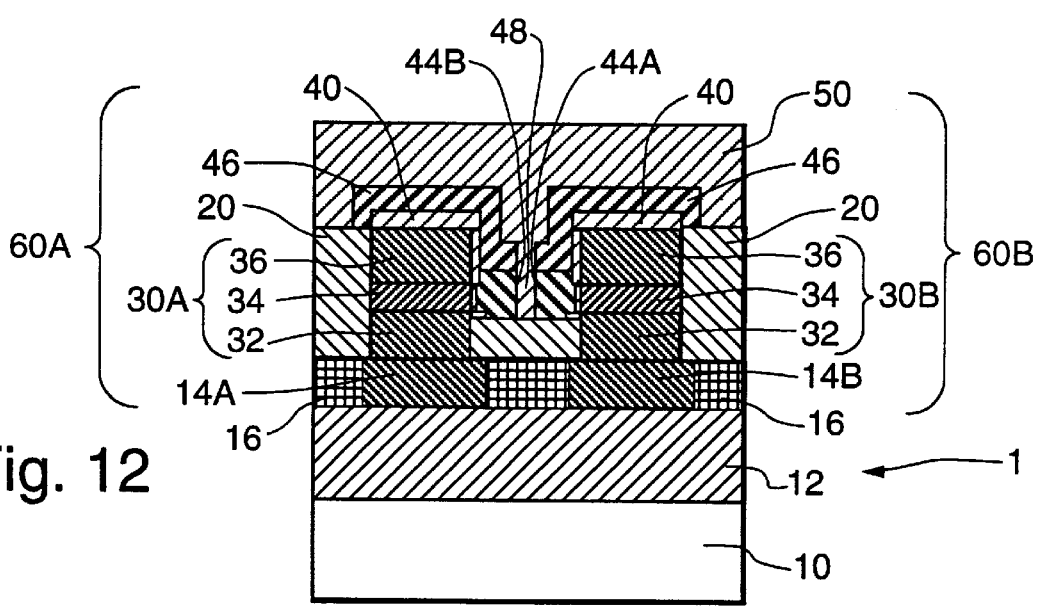
FIG. 12 shows the structure of FIG. 11 after a portion of the barrier layer and gate intermediate the epitaxial silicon stacks has been removed and a cap dielectric layer has been formed.

Following formation of the barrier layer 46, portions of the barrier layer 46 (if used) and gate 44 are removed and a cap dielectric layer 50 is formed, such that two vertical channel field effect transistors 60A and 60B are formed. This structure is illustrated in FIG. 12. As shown in FIG. 12, portions of the barrier layer 46 and gate 44 are removed to form a divider trench 48 at a position intermediate the vertical channel field effect transistors 60A and 60B. The divider trench 48 can be formed using conventional techniques. Preferably, the divider trench 48 is formed by reactive ion etching (RIE) the barrier layer 46 and gate 44.

The cap dielectric layer 50 is formed in the divider trench 48 such that it electrically isolates the vertical channel field effect transistors 60A, 60B from one another. The cap dielectric layer 50 is composed of a dielectric material. Preferably, the cap dielectric layer 50 is an oxide, such as tetraethosiloxane (TEOS) oxide.

Each vertical channel field effect transistor of the present invention (shown in FIG. 12 as 60A and 60B) has a gate (shown as gates 44A and 44B) and an epitaxial silicon stack (shown as 30A and 30B). Each epitaxial silicon stack 30A, 30B has a bottom terminal 32, a channel 34, and a top terminal 36.

Following formation of the single gated vertical channel field effect transistor of the present invention, contacts to the bottom terminal 32, gate 44, and top terminal 36 can be formed using conventional techniques known in the art. The bottom terminal 32 and top terminal 36 are wired such that one is the source and the other is the drain of the field effect transistor, depending on the particular use of the field effect transistor.

DUAL GATE

Figure 13:
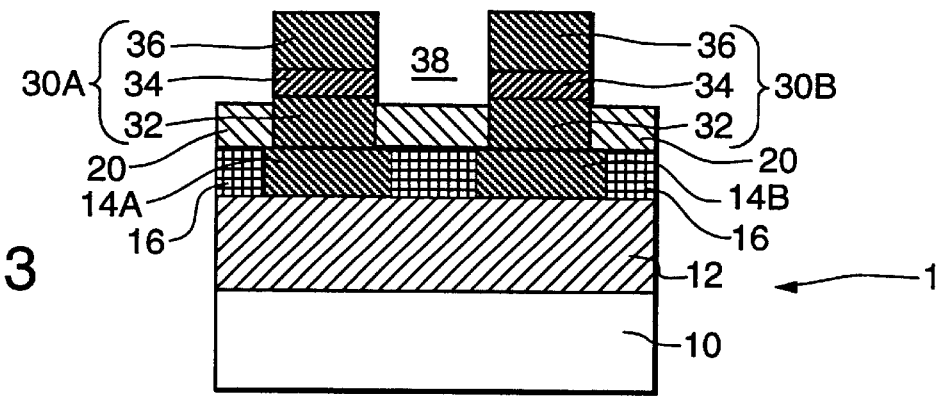
FIG. 13 shows the structure of FIG. 6 after the mask has been removed adjacent the top terminal, channel, and a portion of the bottom terminal.

Another embodiment of the present invention includes a vertical channel field effect transistor having dual gates. The process of forming a dual gate vertical channel field effect transistor of the invention is described next. Following formation of the epitaxial silicon stack 30A, 30B, the structure of which is illustrated in FIG. 6, the mask 20 is removed to expose portions of the top terminal 36, channel 34, and the bottom terminal 32. The resulting structure is illustrated in FIG. 13. The mask 20 can be removed using conventional techniques. Preferably, the mask 20 is removed using photolithography and reactive ion etching (RIE) the mask 20.

Figure 14:
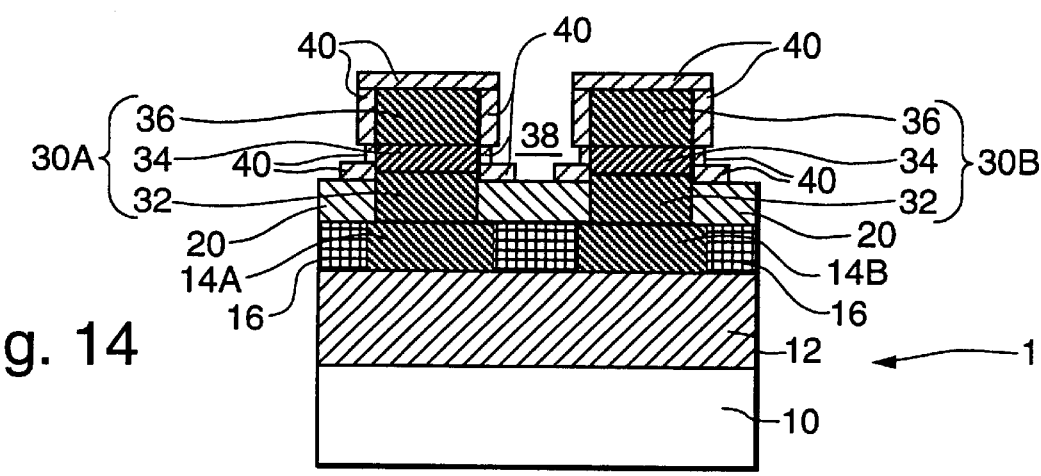
FIG. 14 shows the structure of FIG. 13 in which a gate dielectric layer covers the exposed portions of the top terminal, the channel, and the bottom terminal.

In the next step of the process of the present invention, a gate dielectric layer 40 is formed on the exposed portions of the epitaxial silicon stack 30A, 30B. Thus, the gate dielectric layer 40 is formed on the top terminal 36, the channel 34, and the bottom terminal 32. The resulting structure is illustrated in FIG. 14.

The gate dielectric layer 40 is composed of a dielectric material and can be formed using conventional techniques. The gate dielectric layer 40 reduces the source/drain-to-gate leakage. In a preferred embodiment, the gate dielectric layer 40 comprises an oxide, such as silicon oxide, formed by thermal oxidation. As shown in FIG. 14, when forming the gate dielectric layer 40 by thermal oxidation, the thickness of the gate dielectric layer 40 adjacent the bottom terminal 32 and top terminal 36 is greater than the thickness of the gate dielectric layer 40 adjacent the channel 34. This is a result of the differing doping characteristics of these layers and is described by S. Campbell in his book referenced above.

Figure 15:
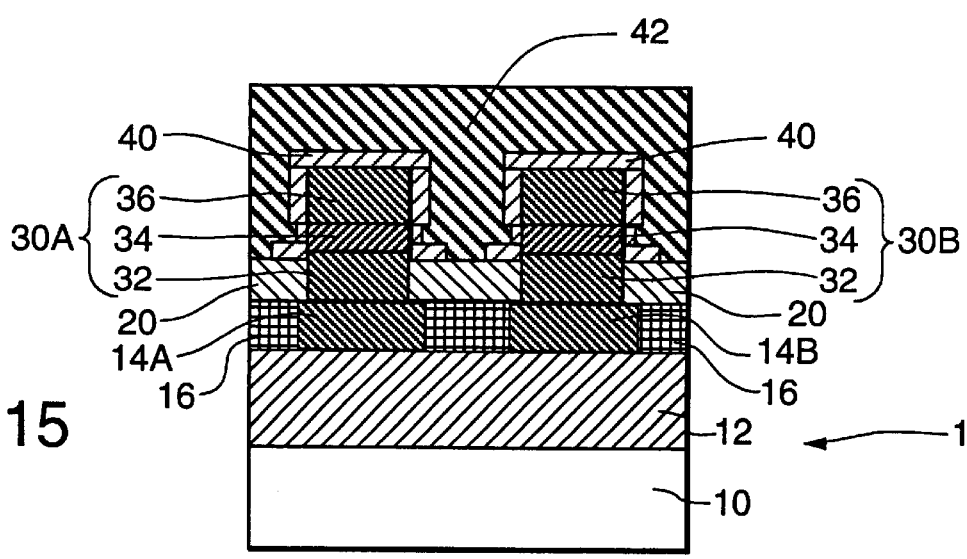
FIG. 15 shows the structure of FIG. 14 having a gate layer formed.

Following formation of the gate dielectric layer 40, two gates are formed for each epitaxial silicon stack (shown in FIG. 14 as epitaxial stacks 30A and 30B) to form the dual gate vertical channel field effect transistor of the present invention. The two gates are formed such that each gate contacts the gate dielectric layer 40 and is positioned adjacent the channel 34 and at least a portion of the bottom terminal 32 and top terminal 36. The gates can be formed by first forming a gate layer 42 covering the mask 20 and gate dielectric layer 40. This structure is illustrated in FIG. 15.

Figure 16:
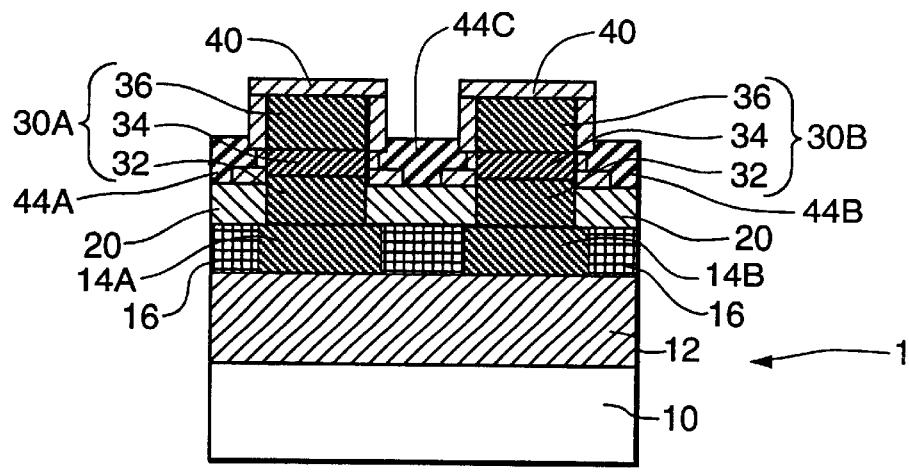
FIG. 16 shows the structure of FIG. 15 after the gate layer has been partially removed to form a gate.

Next, the gate layer 42 is selectively removed such that gates 44A, 44B, and 44C are formed. As illustrated in FIG. 16, each of gates 44A, 44B, and 44C contacts the gate dielectric layer 40 and is positioned adjacent the channel 34 and at least a portion of the bottom terminal 32 and top terminal 36. The gate layer 42 can be removed using conventional techniques. Preferably, the gate layer 42 is removed to form gates 44A, 44B, and 44C by reactive ion etching (RIE) the gate layer 42.

The gate layer 42 and the gates 44A, 44B, and 44C are composed of a conductive material. Preferably, the gates 44A, 44B, and 44C consist of heavily doped polysilicon of the same doping type as that of the bottom terminal 32 and top terminal 36.

Figure 17:
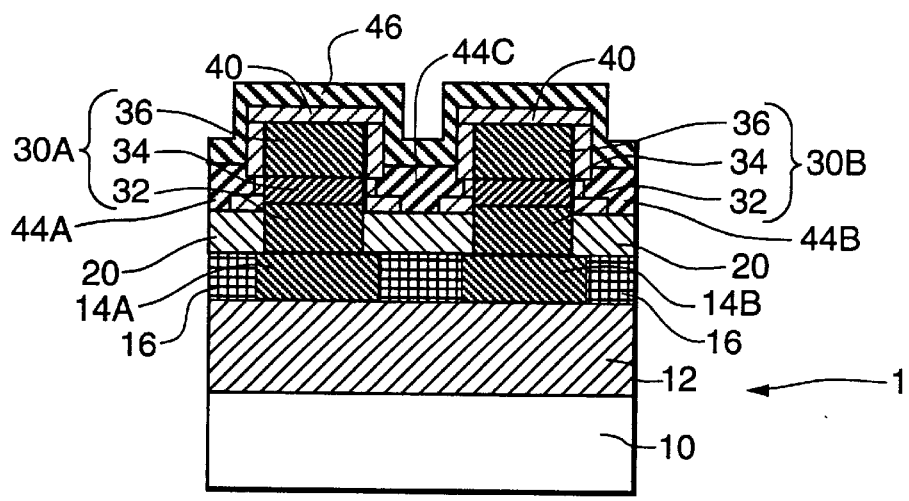
FIG. 17 shows the structure of FIG. 16 having a barrier layer formed.

Following formation of the gates 44A, 44B, and 44C, a barrier layer 46 can optionally be formed to cover the gates 44A, 44B, and 44C and the gate dielectric layer 40 if desired. The resulting structure is illustrated in FIG. 17. The barrier layer 46 is composed of a dielectric material, such as an oxide or a nitride. The barrier layer 46 reduces electrical coupling between the top terminal 36 and the gate contact. In addition, if the barrier layer 46 is composed of a material different from that of the gate dielectric layer 40, the reactive ion etching (RIE) process used to form the gate contact can be self-aligning to the gates 44A, 44B, and 44C, thereby avoiding shorts with the top terminal 36. Preferably, the barrier layer 46 is a low-temperature nitride, such as a nitride deposited by plasma enhanced chemical vapor deposition (PECVD).

Figure 18:
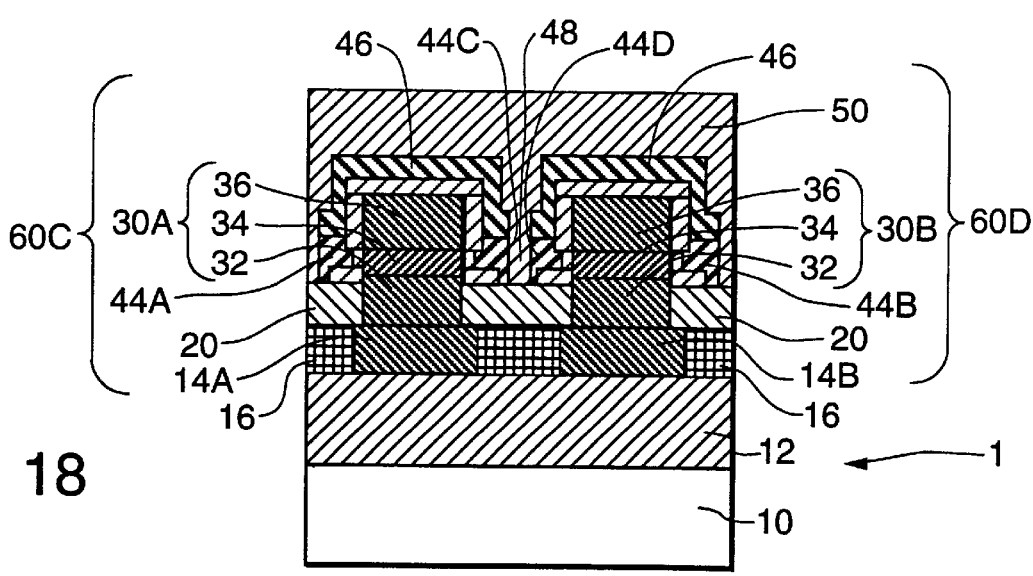
FIG. 18 shows the structure of FIG. 17 after portions of the barrier layer and gate intermediate the epitaxial silicon stacks and adjacent the epitaxial silicon stacks has been removed and a cap dielectric layer has been formed.

Following formation of the barrier layer 46, portions of the barrier layer 46 (if used) and the gate 44C are removed and a cap dielectric layer 50 is formed, such that two vertical channel field effect transistors 60C and 60D are electrically isolated from one another and gate 44C is split into two gates 44C and 44D. This structure is illustrated in FIG. 18. As shown in FIG. 18, portions of the barrier layer 46 and gate 44C are removed to form a divider trench 48 at a position intermediate the vertical channel effect transistors 60C and 60D. The divider trench 48 can be formed using conventional techniques. Preferably, the divider trench 48 is formed by reactive ion etching (RIE) the barrier layer 46 and gate 44C.

The cap dielectric layer 50 is formed in the divider trench 48 such that it electrically isolates vertical channel field effect transistors 60C and 60D from one another. The cap dielectric layer 50 is composed of a dielectric material. Preferably, the cap dielectric layer 50 is an oxide, such as tetraethosiloxane (TEOS) oxide.

As shown in FIG. 18, each of the vertical channel field effect transistors 60C and 60D have two gates 44A, 44B and 44C, 44D, respectively, and an epitaxial silicon stack 30A, 30B, respectively. Each epitaxial silicon stack 30A, 30B comprises a bottom terminal 32, a channel 34, and a top terminal 36.

Following formation of the dual gated vertical channel field effect transistor of the present invention, contacts to the bottom terminal, gate, and top terminal can be formed using conventional techniques known in the art. The bottom terminal and top terminal are wired such that one is the source and the other is the drain of the field effect transistor, depending on the particular use of the field effect transistor.

Although illustrated and described above with reference to specific embodiments, the present invention is nevertheless not intended to be limited to the details shown. Rather, various modifications may be made in the details within the scope and range of equivalents of the claims and without departing from the spirit of the invention. For example, although the process of the present invention is illustrated as forming two vertical channel field effect transistors, it should be appreciated that any number of field effect transistors can be formed on a chip by properly patterning masks, limited only by photolithographic constraints. It should also be appreciated that three or more vertical channel field effect transistors can be formed. As another example, it should be appreciated that two vertical channel field effect transistors can be linked through a common gate, similar to the structures illustrated in FIGS. 11 and 17.

What is claimed is:

1. A vertical channel field effect transistor disposed on a surface of a substrate, said vertical channel field effect transistor comprising:
   an epitaxial silicon stack comprising:
      (i) a bottom terminal disposed on said substrate surface, said bottom terminal comprising heavily doped silicon of a first doping type;
      (ii) a channel disposed on said bottom terminal, said channel comprising lightly doped silicon of opposite doping type from said first doping type; and
      (iii) a top terminal disposed on said channel, said top terminal comprising heavily doped silicon of said first doping type;
   a gate dielectric layer covering:
      (i) a portion of said bottom terminal;
      (ii) said channel, and
      (iii) said top terminal; and
   a gate in contact with said dielectric layer and overlapping:
      (i) a portion of said bottom terminal;
      (ii) said channel; and
      (iii) a portion of said top terminal,
         wherein said channel has a thickness between said bottom terminal and said top terminal from about 50 angstroms to about 800 angstroms.

2. The vertical channel field effect transistor of claim 1 wherein said substrate is a silicon-on-insulator substrate comprising a silicon island disposed on an insulator layer and wherein said bottom terminal is disposed on said silicon island.

3. The vertical channel field effect transistor of claim 1 further comprising a barrier layer disposed on said gate dielectric layer and said gate.

4. The vertical channel field effect transistor of claim 1 wherein the thickness of said channel is from about 100 angstroms to about 500 angstroms.

5. The vertical channel field effect transistor of claim 1 wherein said bottom terminal has a thickness of from about 200 angstroms to about 800 angstroms.

6. The vertical channel field effect transistor of claim 1 wherein said top terminal has a thickness of from about 500 angstroms to about 1500 angstroms.

7. The vertical channel field effect transistor of claim 1 further comprising a second gate in contact with said gate dielectric layer, said second gate positioned adjacent said channel and adjacent a portion of said bottom terminal and a portion of said top terminal.

* * * * *